(12) United States Patent
Jang

(10) Patent No.: US 7,944,232 B2
(45) Date of Patent: May 17, 2011

(54) OUTPUT CIRCUIT HAVING VARIABLE OUTPUT VOLTAGE SWING LEVEL

(75) Inventor: Young-Chan Jang, Yongin-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

(21) Appl. No.: 12/588,478

(22) Filed: Oct. 16, 2009

(65) Prior Publication Data

US 2010/0097094 A1      Apr. 22, 2010

(30) Foreign Application Priority Data

Oct. 21, 2008   (KR) .................. 10-2008-0103245

(51) Int. Cl.
*H03K 17/16*          (2006.01)
(52) U.S. Cl. ............... 326/30; 326/21; 326/86; 327/108
(58) Field of Classification Search ............... 326/30, 326/21–27, 86, 83; 327/108, 109, 112
See application file for complete search history.

(56) References Cited

U.S. PATENT DOCUMENTS

| | | | |
|---|---|---|---|
| 5,602,494 A * | 2/1997 | Sundstrom | 326/39 |
| 6,026,456 A * | 2/2000 | Ilkbahar | 710/100 |
| 7,038,486 B2 * | 5/2006 | Aoyama et al. | 326/30 |
| 7,239,560 B2 * | 7/2007 | Lee et al. | 365/189.05 |
| 7,589,554 B2 * | 9/2009 | Hamanaka | 326/30 |
| 2005/0052200 A1 | 3/2005 | Nguyen et al. | |
| 2005/0077953 A1* | 4/2005 | Funaba | 327/540 |
| 2005/0088150 A1* | 4/2005 | Hamanaka | 323/208 |
| 2006/0132171 A1 | 6/2006 | Nguyen | |

* cited by examiner

*Primary Examiner* — Vibol Tan
(74) *Attorney, Agent, or Firm* — Harness, Dickey & Pierce, P.L.C.

(57) ABSTRACT

An output circuit having a variable swing level of a terminated output data signal is disclosed. The output circuit includes a control circuit configured to generate a first control signal and a second control signal in response to a voltage swing level selection signal and an output enable signal. The output circuit further includes an output driving circuit configured to, in response to the first and second control signals, perform on-die termination in an input mode and configured to control swing level of a signal output from the output circuit in an output mode.

20 Claims, 15 Drawing Sheets

FIG. 10

| RDRV[Ω] | RPT[Ω] | ZOUT[Ω] | VSUP[V] | VOH[V] | VOL[V] | VSW[mV] | TX_SW2 | TX_SW1 | TX_SW0 | PT_480 | PT_240 | PT_120 |
|---|---|---|---|---|---|---|---|---|---|---|---|---|
| 240 | 120 | 48 | 1.5 | 0.90 | 0.60 | 300 | H | L | L | L | L | H |
| 120 | 160 | 48 | 1.5 | 1.05 | 0.45 | 600 | L | H | L | H | H | L |
| 80 | 240 | 48 | 1.5 | 1.20 | 0.30 | 900 | H | H | L | L | H | L |
| 60 | 480 | 48 | 1.5 | 1.35 | 0.15 | 1200 | L | L | H | H | L | L |
| 48 | ∞ | 48 | 1.5 | 1.50 | 0.00 | 1500 | H | H | H | L | L | L |

OUTPUT CIRCUIT HAVING VARIABLE OUTPUT VOLTAGE SWING LEVEL

CROSS-REFERENCE TO RELATED APPLICATION(S)

This application claims priority under 35 U.S.C. §119 to Korean Patent Application No. 10-2008-0103245, filed Oct. 21, 2008, in the Korean Intellectual Property Office (KIPO), the entire contents of which are incorporated herein by reference.

BACKGROUND

1. Field

Example embodiments relate to output circuits, for example, output circuits capable of controlling swing level of an output data signal, semiconductor devices and communication systems including the same.

2. Description of Related Art

In the related art, semiconductor devices such as volatile and non-volatile memories include input and output blocks. These input and output blocks interface with external devices such as processors and other peripheral devices. A related art output block includes an output driving unit. A related art output driving unit includes an output driving part and an on-die termination part. During an output mode, the output driving part buffers an output data signal, and outputs the buffered output data signal to an external device. The on-die termination part matches impedance with a channel connected between the semiconductor device and the external device to improve signal integrity.

To adapt to various channel environments, it may be necessary to control swing level of the voltage of output data signals from the output driving unit. Conventionally, the swing level of the output data signal is controlled by changing the high power voltage level and low power voltage level of the output driving unit. But, changing the power voltage level has some limitations on controlling the swing level of the output data signal. Particularly, for example, as demand of lower power consumption of semiconductor devices and/or communication systems increases, power may also need to be lowered so that transistors included in the output driving unit may not turn on, and the turn-on resistance of the transistors increases such that operating speed of the semiconductor device or communication system decreases. Also, changing of the power voltage level may cause difficulty in impedance matching so that signal integrity may not be guaranteed.

SUMMARY

According to at least one example embodiment, an output circuit includes a control block and an output driving block. The control block is configured to generate a first control signal and a second control signal in response to a voltage swing selection signal and an output enable signal. The output driving block includes an output driving part and a parallel termination part. The output driving part operates in response to the first control signal, and the parallel termination part operates in response to the second control signal. An output node is commonly connected to the output driving part and the parallel termination part.

According to at least some example embodiments, the control block includes a driving control part and a parallel termination control part. The driving control part is configured to generate the first control signal in response to an output data signal, and configured to generate a data selection signal in response to the voltage swing selection signal in an output mode. The parallel termination control part is configured to generate the second control signal in response to the output enable signal, and configured to generate a parallel termination signal in response to the voltage level control signal in the output mode.

The control block further includes a lookup table part. The lookup table part is configured to generate the data selection signal and the parallel termination signal in response to the voltage level control signal. The driving control part is configured to generate the first control signal in response to an on-die termination enable signal and an on-die termination selection signal in an input mode.

According to at least some example embodiments, the output driving part includes at least one circuit branch. Each of the at least one circuit branches includes a pull-up transistor and a pull-up resistor connected serially between a first high power voltage and the output node. Each of the at least one circuit branches further includes a pull-down transistor and a pull-down resistor connected serially between a first low power voltage and the output node. Each of the pull-up and pull-down transistors operates in response to the first control signal.

The parallel termination part includes at least one circuit branch. Each of the at least one circuit branches includes a pull-up transistor and a pull-up resistor connected serially between a second high power voltage and the output node. Each of the at least one circuit branches further includes a pull-down transistor and a pull-down transistor connected serially between a second low power voltage and the output node. Each of the pull-up and pull-down transistors operates in response to the second control signal.

According to at least some example embodiments, the first high power voltage may be the same as the second high power voltage. The pull-up resistor and the pull-down resistor included in the output driving part may have the same or substantially the same resistance. The pull-up resistor and the pull-down resistor included in the parallel termination block may have the same or substantially the same resistance.

According to at least one other example embodiment, an output device includes a control circuit and an output driving circuit. The control circuit is configured to generate gate control signals in response to a voltage swing selection signal. The output driving circuit is configured to perform an on-die termination in response to the gate control signals during an input mode, and configured to output a terminated output data signal by a variable parallel termination to vary the voltage swing width of the terminated output data signal during an output mode. The output circuit may further include a look-up table part configured to generate output data selection signals and parallel termination signals in response to a voltage swing information signal.

According to at least one other example embodiment, a semiconductor device includes an input circuit and an output circuit. The input circuit is configured to receive input data from an external device, and the output circuit is configured to output a terminated output data signal. The output circuit includes a control block and an output driving block. The control block is configured to generate gate control signals in response to a voltage swing selection signal. The output driving block is configured to perform an on-die termination in response to the gate control signals during an input mode, and configured to output a terminated output data signal by a variable parallel termination to vary the swing width of the terminated output data signal during an output mode.

BRIEF DESCRIPTION OF THE DRAWINGS

Example embodiments are described in further detail below with reference to the accompanying drawings. It should be understood that various aspects of the drawings may have been exaggerated for clarity. In the drawings:

FIG. 10 illustrates an example embodiment of look-up table part;

DETAILED DESCRIPTION

Figure 1:
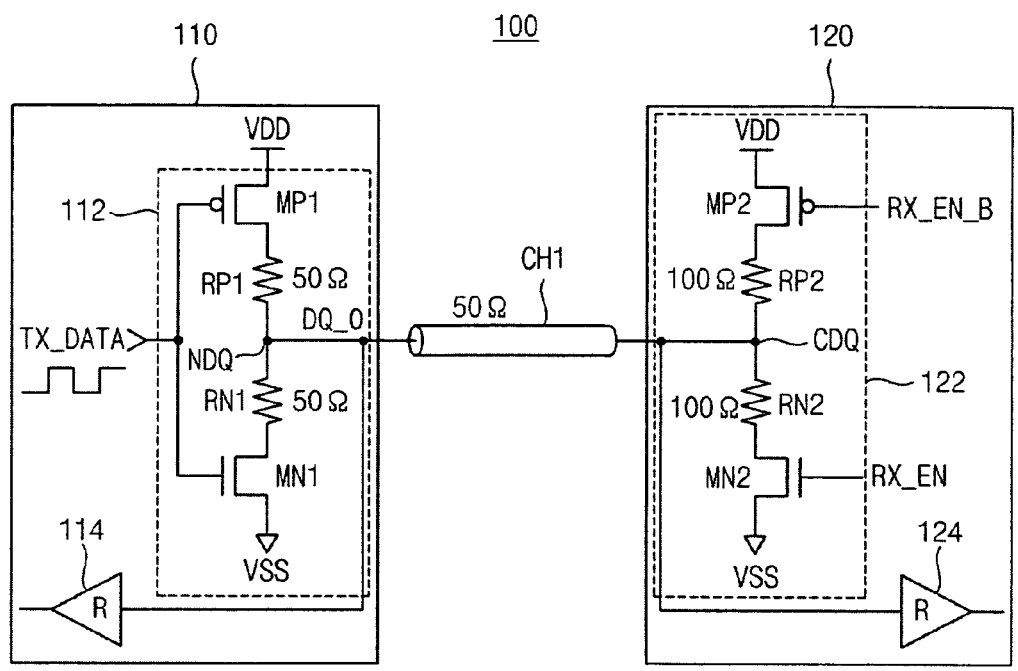
FIG. 1 shows a related art communication system including a destination device having on-die termination.

Detailed example embodiments are disclosed herein. However, specific structural and/or functional details disclosed herein are merely representative for purposes of describing example embodiments. The claims may, however, may be embodied in many alternate forms and should not be construed as limited to only example embodiments set forth herein.

The general inventive concept will now be described more fully with reference to the accompanying drawings, in which example embodiments are shown. In the drawings, the thicknesses of layers and regions are exaggerated for clarity. Like reference numerals in the drawings denote like elements. In the drawings, the thicknesses of layers and regions are exaggerated for clarity.

Detailed illustrative embodiments are disclosed herein. However, specific structural and functional details disclosed herein are merely representative for purposes of describing example embodiments. The general inventive concept may, however, may be embodied in many alternate forms and should not be construed as limited to only the example embodiments set forth herein.

It should be understood, however, that there is no intent to limit the general inventive concept to the particular example embodiments disclosed, but on the contrary example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Various example embodiments of the present invention will now be described more fully with reference to the accompanying drawings in which some example embodiments of the invention are shown.

FIG. 1 shows a related art communication system including a destination semiconductor device having an on-die termination part.

Referring to FIG. 1, the communication system 100 includes a first semiconductor device 110 and a second semiconductor device 120. The first semiconductor device 110 includes an input circuit 114 and an output driving circuit 112. Although not shown, the first semiconductor device 110 also includes an on-die termination circuit for receiving input signal from a channel CH1.

The second semiconductor device 120 includes an input circuit 124 and an on-die termination circuit 122. Although not shown, the second semiconductor device 120 also includes an output circuit connected to the channel CH1. In this example, impedance of the channel CH1 in FIG. 1 may be about 50 Ω.

As shown in FIG. 1, the output driving circuit 112 includes a transistor MP1 and resistor RP1 connected serially between high power voltage VDD and an output node NDQ. The output driving circuit 112 further includes a transistor MN1 and resistor RN1 connected serially between the output node NDQ and low power voltage VSS. The impedance of the output driving circuit 112 may be the same or substantially the same as the impedance of the channel CH1. For example, the impedance of the output driving circuit 112 may be about 50Ω. When the value of impedance of the output driving circuit 112 matches that of the channel, more accurate signal integrity may be realized.

The on-die termination circuit 122 of the second semiconductor device 120 includes a transistor MP2 and resistor RP2 connected serially between high power voltage VDD and a common node CDQ. The on-die termination circuit 122 further includes a transistor MN2 and resistor RN2 connected serially between the common node CDQ and low power voltage VSS.

In operation, when the output data TX_DATA has a logic "LOW" state, transistor MP1 turns on and transistor MN1 turns off so that the value of impedance of the output driving circuit 112 becomes about 50Ω. This impedance is the sum of the turn-on resistance of the transistor MP1 and the resistance of the resistor RP1 between transistor MP1 and the output node NDQ.

When the output data TX_DATA has a logic "HIGH" state, transistor MN1 turns on and transistor MP1 turns off such that the value of impedance of the output driving circuit 112 is about 50Ω. Also, the resistance of the resistors RP2 and RN2 in the on-die termination circuit 122 of the second semiconductor device 120 are designed to have the same or substantially the same impedance as that of the channel CH1 such that the communications system 100 has an impedance of about 100Ω.

Transistor MP1 and transistor MN1 may not be turned on at the same time in response to the output data TX_DATA. But, the transistors MP2 and MN2 in the on-die termination circuit 122 of the second semiconductor device 120 may be turned on at the same or substantially the same time in response to input control signals RX_EN_B and RX_EN.

Referring still to FIG. 1, a minimum voltage level VOL and a maximum voltage level VOH of the output data signal DQ_0 are given by Equations 1 and 2, respectively, shown below.

$$VOL = \frac{50 // 100}{50 // 100 + 100} \times VDD \quad \text{[Equation 1]}$$

$$VOH = \frac{100}{50 // 100 + 100} \times VDD \quad \text{[Equation 2]}$$

As shown in Equations 1 and 2, when high power voltage VDD is about 1.5 V, minimum voltage level VOL is about 0.375V and maximum voltage level VOH is about 1.125V. Thus, the difference between minimum voltage level VOL and maximum voltage level VOH is about 750 mV. This voltage difference between the maximum voltage level VOH and the minimum voltage level VOL is referred to as the output voltage swing width or output voltage swing level.

Figure 2:
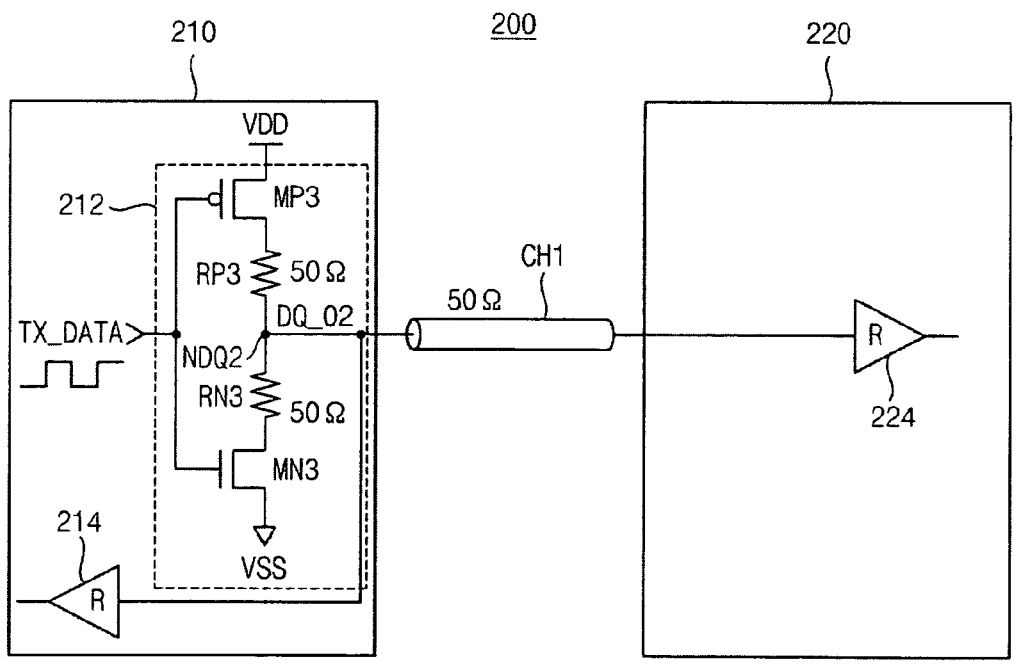
FIG. 2 is a detailed view of a related art selection signal generator, a first dividing circuit, and a second dividing circuit shown in FIG. 1.

FIG. 2. shows another related art communication system to assist in explaining swing level or width of an output data signal when a destination semiconductor device does not have on-die termination circuit.

Referring to FIG. 2, the related art communication system 200 includes a third semiconductor device 210 and a fourth semiconductor device 220. The third semiconductor device 210 includes an input circuit 214 and an output driving circuit 212. The fourth semiconductor device 220 includes an input circuit 224, but does not include an on-die termination circuit. The output driving circuit 212 includes a transistor MP3 and a resistor RP3 connected between high power voltage VDD and an output node NDQ2. A transistor MN3 and a resistor RN3 are connected between the output node NDQ2 and low power voltage VSS.

In FIG. 2, a minimum voltage level VOL and a maximum voltage level VOH of the output data signal DQ_02 are expressed by Equations 3 and 4, respectively, shown below.

$$VOL = \frac{50 // \infty}{50 // \infty + \infty} \times (VDD + VSS) + VSS = VSS \quad \text{[Equation 3]}$$

$$VOH = \frac{\infty}{50 // \infty + \infty} \times (VDD - VSS) + VSS = VDD \quad \text{[Equation 4]}$$

In this example, when high power voltage VDD is about 1.5 V, the minimum voltage level VOL becomes about VSS and the maximum voltage level VOH becomes about VDD. Thus, the difference between the minimum voltage level VOL and the maximum voltage level VOH is about VDD−VSS. This voltage difference is also referred to as the output voltage swing level or width.

As expressed in Equations 1 through 4 above, the high power voltage level VDD, the low power voltage level VSS, and the resistance of the output driving circuit may be controlled to change the swing width of the output voltage. In these examples, the output voltage swing width corresponds to the difference between the maximum voltage level VOH and the minimum voltage level VOL of the output data signal. But, as discussed above, changing the voltage swing width of the output data signal by varying the high and low power voltage levels has some limitations.

Figure 3:
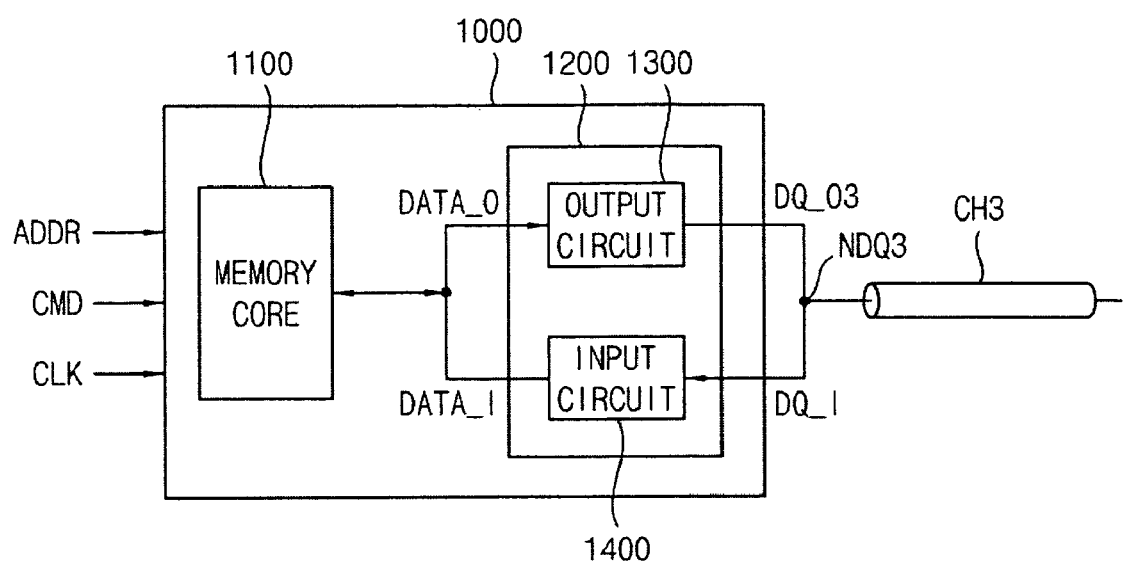
FIG. 3 is a block diagram showing a semiconductor device in accordance with an example embodiment.

FIG. 3 is a block diagram showing a semiconductor device in accordance with an example embodiment. The semiconductor device shown in FIG. 3 may be a memory device such as a volatile memory or non-volatile memory.

Referring to FIG. 3, according to at least this example embodiment, the semiconductor device 1000 includes a memory core 1100 and an input/output unit 1200. The input/output unit 1200 is also referred to herein as an interfacing unit 1200. The interfacing unit 1200 includes an input circuit 1400 and an output circuit 1300. The input circuit 1400 receives data signal DQ_I from an external circuit and provides the data DATA_I carried by the data signal DQ_I to the memory core 1100.

The input/output unit 1200 also includes an output circuit 1300. The output circuit 1300 receives data DATA_O output from the memory core 1100, and transmits an output data signal DQ_O3 including the received data DATA_O to an external circuit through a channel CH3. The interfacing unit 1200 in FIG. 3 supports bi-directional signaling. However, if the interfacing unit 1200 supports only uni-directional signaling, the input/output unit 1200 may include only the output circuit 1300.

Still referring to FIG. 3, the interfacing unit 1200 is connected to an input/output node NDQ3. The input/output node NDQ3 is further connected to an end of the channel CH3. The other end of the channel CH3 may be connected to another semiconductor device.

As will be explained in more detail later, the output circuit 1300 may perform on-die termination during an input mode, but may control the voltage swing width of an output data signal DQ_O using, for example, variable parallel termination in an output mode.

Figure 4:
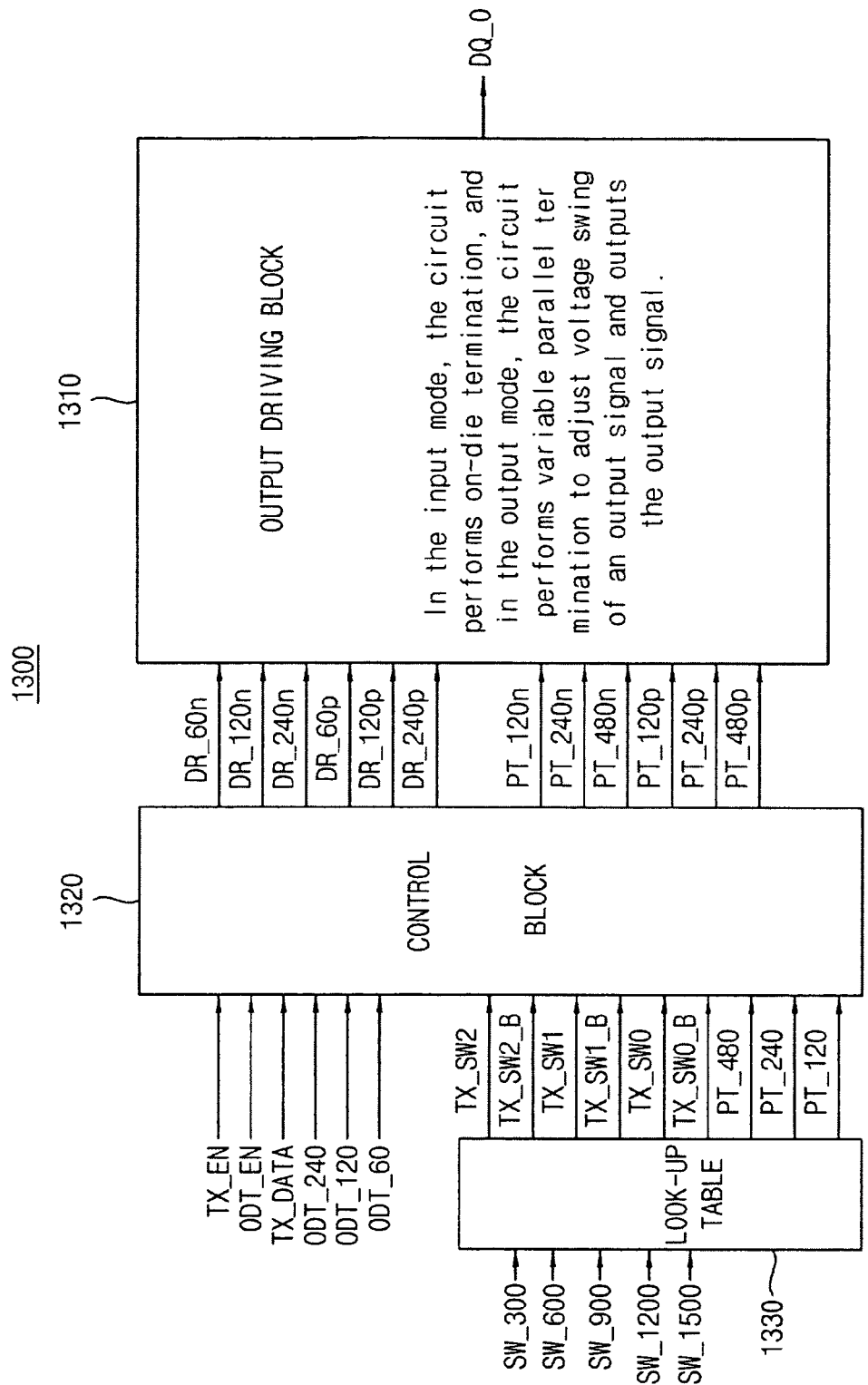
FIG. 4 is an example of the output driving block included in the semiconductor device of FIG. 3 according to an example embodiment.

FIG. 4 shows an example embodiment of an output circuit 1300 included in the semiconductor device of FIG. 3.

Referring to FIG. 4, according to at least this example embodiment, the output circuit 1300 includes an output driving block 1310 and a control block 1320. The control block 1320 may generate first control signals DR_60n, DR_120n, DR_240n, DR_60p, DR_120p and DR_240p and second control signals PT_120n, PT_240n, PT_480n, PT_120p, PT_240p and PT_480p in response to an output enable signal TX_EN, a data signal TX_DATA, data selection signals TX_SW2, TX_SW2_B, TX_SW1, TX_SW1_B, TX_SW0, TX_SW0_B and parallel termination signals PT_480, PT_240, PT_120, on-die termination enable signal ODT_EN and on-die termination selection signals ODT_240, ODT_120, ODT_60. The first control signals DR_60n, DR_120n, DR_240n, DR_60p, DR_120p and DR_240p may also be referred to herein as driving unit control signals DR_60n, DR_120n, DR_240n, DR_60p, DR_120p and DR_240p. The second control signals PT_120n, PT_240n, PT_480n, PT_120p, PT_240p and PT_480p may be referred to herein as parallel termination control signals PT_120n, PT_240n, PT_480n, PT_120p, PT_240p and PT_480p.

During an input mode, the output driving block 1310 may perform on-die termination in response to the first control signals DR_60n, DR_120n, DR_240n, DR_60p, DR_120p and DR_240p. During an output mode, the output driving block 1310 may perform variable parallel termination of the data signal TX_DATA and output the output data signal DQ_O as terminated output data in response to the first control signals DR_60n, DR_120n, DR_240n, DR_60p, DR_120p and DR_240p and the second control signals PT_120n, PT_240n, PT_480n, PT_120p, PT_240p and PT_480p. The terminated output data reflects the result of variable parallel termination at the output driving block 1310. The output data signal DQ_O may correspond to data signal TX_DATA input to the control block 1320.

The output circuit 1300 may further include a look-up table 1330. The look-up table 1330 may generate the data selection signals TX_SW2, TX_SW2_B, TX_SW1, TX_SW1_B, TX_SW0, TX_SW0_B and the parallel termination signals PT_480, PT_240, PT_120 in response to voltage swing selection signals SW_300, SW_600, SW_900, SW_1200 and SW_1500. The voltage swing selection signals SW_300, SW_600, SW_900, SW_1200 and SW_1500 may be set, for example, by a user during a power-up sequence using a mode register set (MRS) operation. Because MRS operations are known, a detailed discussion will be omitted.

Figure 5:
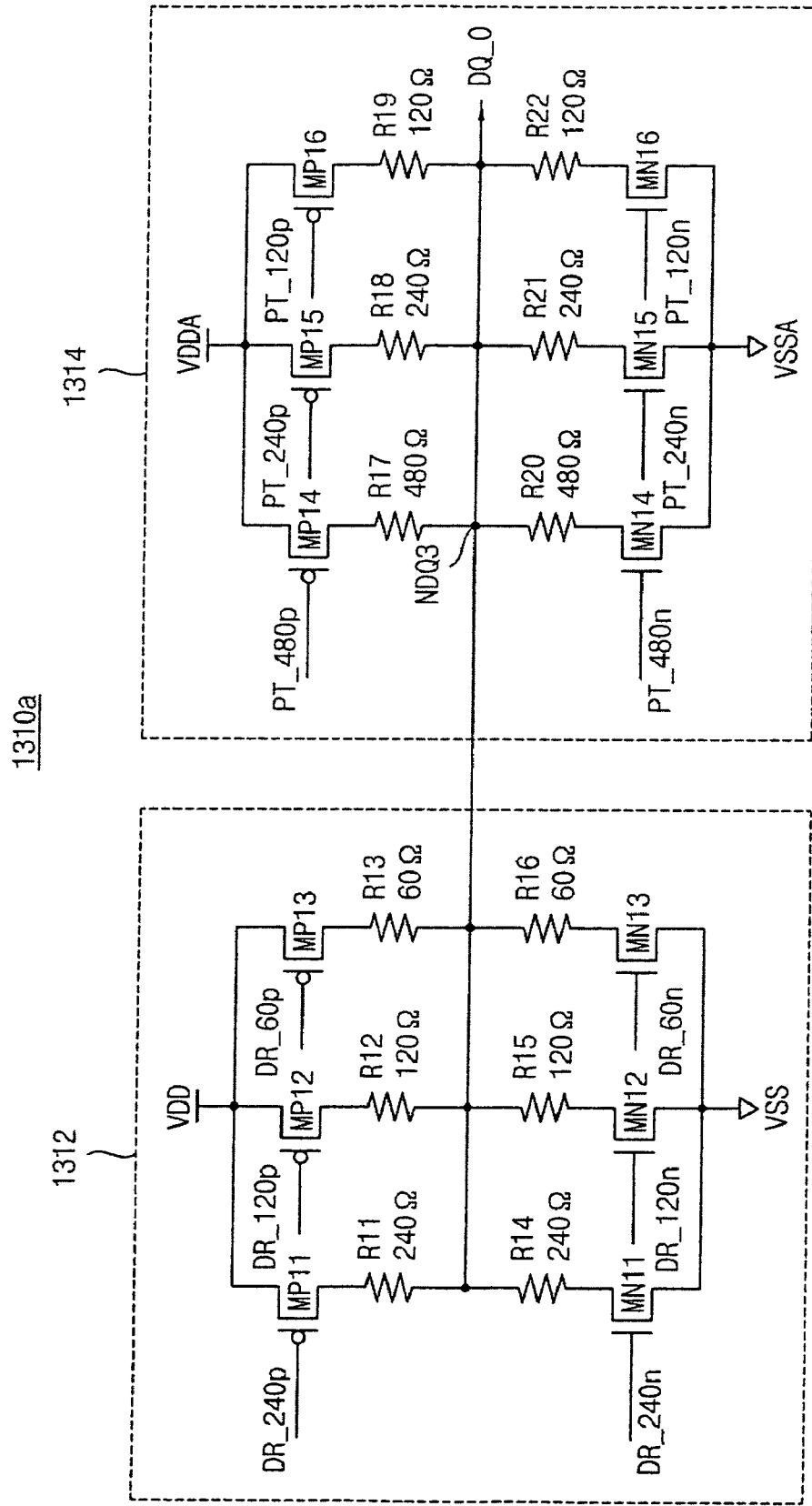
FIG. 5 illustrates an example embodiment of an output driving block in more detail.

FIG. 5 illustrates an example embodiment of an output driving block of the output driving circuit of FIG. 4 in more detail.

Referring to FIG. 5, according to at least this example embodiment the output driving block 1310a includes an output driving part 1312 and a parallel termination part 1314. The output driving part 1312 performs on-die termination during the input mode, whereas the parallel termination part 1314 performs a variable parallel termination function to adjust an swing width of the output data signal DQ_O3 during the output mode.

The output driving part 1312 may include at least one circuit branch connected between the high power voltage VDD and the low power voltage VSS. For example, in FIG. 5, the output driving part 1312 includes first through third circuit branches connected to the output node NDQ3. Each of the first through third circuit branches are connected in parallel and include one of pull-up transistors of MP11 through MP13 and one of pull-up resistors R11 through R13 connected serially between the first high power voltage VDD and the output node NDQ3.

Each of the first through third circuit branches also includes one of pull-down transistors of MN11 through MN13 and one of pull-down resistors of R14 through R16 connected serially between a first low power voltage VSS and the output node NDQ3. Each of the first through third circuit branches may be operated in response to a corresponding one of the first control signals DR_60n, DR_120n, DR_240n, DR_60p, DR_120p and DR_240p.

For example, as shown in FIG. 5 the first circuit branch includes a first pull-up transistor (e.g., a PMOS transistor) MP11 and a resistor R11 connected serially between first high power voltage VDD and the output node NDQ3. The first circuit branch also includes a first pull-down transistor (e.g., an NMOS transistor) MN11 and a resistor R14 connected serially between the first low power voltage VSS and the output node NDQ3. The first pull-up transistor MP11 is selectively activated and deactivated in response to first control signal DR_240p. The first pull-down transistor MN11 is selectively activated and deactivated in response to the first control signal DR_240n.

The second circuit branch includes a second pull-up transistor (e.g., a PMOS transistor) MP12 and a resistor R12 connected serially between first high power voltage VDD and the output node NDQ3. The second circuit branch also includes a second pull-down transistor (e.g., an NMOS transistor) MN12 and a resistor R15 connected serially between the first low power voltage VSS and the output node NDQ3. The second pull-up transistor MP12 is selectively activated and deactivated in response to first control signal DR_120p. The second pull-down transistor MN12 is selectively activated and deactivated in response to the first control signal DR_120n.

The third circuit branch includes a third pull-up transistor (e.g., a PMOS transistor) MP13 and a resistor R13 connected serially between first high power voltage VDD and the output node NDQ3. The third circuit branch also includes a third pull-down transistor (e.g., an NMOS transistor) MN13 and a resistor R16 connected serially between the first low power voltage VSS and the output node NDQ3. The third pull-up transistor MP13 is selectively activated and deactivated in response to first control signal DR_60p. The third pull-down transistor MN13 is selectively activated and deactivated in response to the first control signal DR_60n.

The parallel termination part 1314 may also include at least one circuit branch. Referring to the example embodiment shown in FIG. 5, the parallel termination part 1314 includes fourth through sixth circuit branches connected to the output node NDQ3. Each of the fourth through sixth circuit branches includes one of pull-up transistors of MP14 through MP16 and one of pull-up resistors of R17 through R19 connected serially between a second high power voltage VDDA and the output node NDQ3. Each of the fourth through sixth circuit branches also includes one of pull-down transistors of MN14 through MN16 and one of pull-down transistors of R20 through R22 connected serially between a second low power voltage VSSA and the output node NDQ3. Each of the fourth through sixth circuit branches may be operated in response to a corresponding one of the second control signals PT_120n, PT_240n, PT_480n, PT_120p, PT_240p and PT_480p.

For example, the fourth circuit branch includes a fourth pull-up transistor (e.g., a PMOS transistor) MP14 and a resistor R17 connected serially between second high power voltage VDDA and the output node NDQ3. The fourth circuit branch also includes a fourth pull-down transistor (e.g., an NMOS transistor) MN14 and a resistor R20 connected serially between the second low power voltage VSSA and the output node NDQ3. The fourth pull-up transistor MP14 is selectively activated and deactivated in response to second control signal PT_480p. The fourth pull-down transistor MN14 is selectively activated and deactivated in response to the second control signal PT_480n.

The fifth circuit branch includes a fifth pull-up transistor (e.g., a PMOS transistor) MP15 and a resistor R18 connected serially between second high power voltage VDDA and the output node NDQ3. The fifth circuit branch also includes a fifth pull-down transistor (e.g., an NMOS transistor) MN15 and a resistor R21 connected serially between the second low power voltage VSSA and the output node NDQ3. The fifth pull-up transistor MP15 is selectively activated and deactivated in response to second control signal PT_240p. The fifth pull-down transistor MN15 is selectively activated and deactivated in response to the second control signal PT_240n.

The sixth circuit branch includes a sixth pull-up transistor (e.g., a PMOS transistor) MP116 and a resistor R19 connected serially between second high power voltage VDDA and the output node NDQ3. The sixth circuit branch also includes a sixth pull-down transistor (e.g., an NMOS transistor) MN16 and a resistor R22 connected serially between the second low power voltage VSSA and the output node NDQ3. The sixth pull-up transistor MP16 is selectively activated and deactivated in response to second control signal PT_120p. The sixth pull-down transistor MN16 is selectively activated and deactivated in response to the second control signal PT_120n.

In the example embodiment shown in FIG. 5, the resistance of each of resistors R11-R22 may have the value of the turn-on resistance of transistors connected serially to the corresponding resistor. For example, resistance 240Ω of resistor R11 has the value of turn-on resistance of transistor MP11. Each transistor may have between about 20% and about 30% of the resistance of the resistor, which is connected serially thereto.

The first high power voltage VDD may be same as or different from the second high power voltage VDDA. The first low power voltage VSS may be same as or different from as the second low voltage VSSA.

Resistances of the pull-up resistors (MP11-MP16) and the corresponding pull-down resistors (MN11-MN16) may be same or different. For example, a common node voltage level of the output data signal may be controlled by setting the resistance of a pull-up resistor and its corresponding pull-down resistor to be different.

Figure 6:
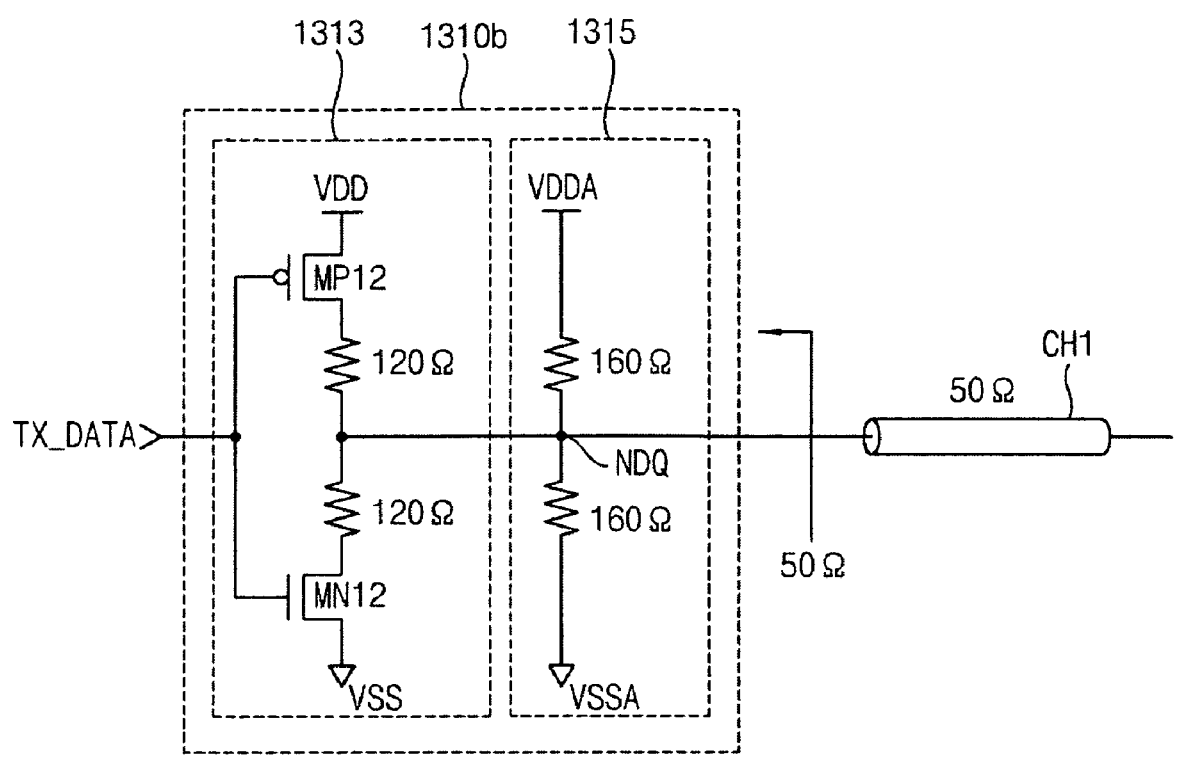
FIG. 6 shows an equivalent circuit of an output driving block after selecting a branch in response to the first and the second control signals of FIG. 5 in accordance with an example embodiment.

FIG. 6 shows an example equivalent circuit of an output driving block after selecting a circuit branch in response to the first and the second control signals of FIG. 5.

Referring to FIG. 6, according to at least this example embodiment the equivalent circuit of output driving block 1310b includes an equivalent driving part 1313 and an equivalent parallel termination part 1315. The equivalent driving part 1313 illustrates the situation in which the second circuit branch of the output driving part 1312, including transistors MP12 and MN12 and resistors R12 and R15 (e.g., having a resistance of about 120Ω), is selected in response to corresponding first control signals DR_120p and DR_120n. The equivalent parallel termination part 1315 illustrates a situation in which fourth and fifth circuit branches of the parallel termination part 1314 are selected in response to corresponding second control signals PT_240p, PT_240n, PT_120p, and PT_120n.

Resistance 160Ω, of the equivalent parallel termination part 1315 is the equivalent resistance of the parallel connection between the fourth circuit branch (e.g., about 480Ω) and fifth circuit branch (e.g., about 240Ω).

According to example embodiments, transistors MP12 and MN12 shown in the equivalent driving part 1313 may not be turned on at the same time. Thus, an impedance of the output driving block 1310 may be about 120Ω//160Ω//160Ω or about 48Ω as a sum of parallel connections between resistors, so that the output driving block 1310 may have the same or substantially the same impedance as that of channel CH1.

Figure 7:
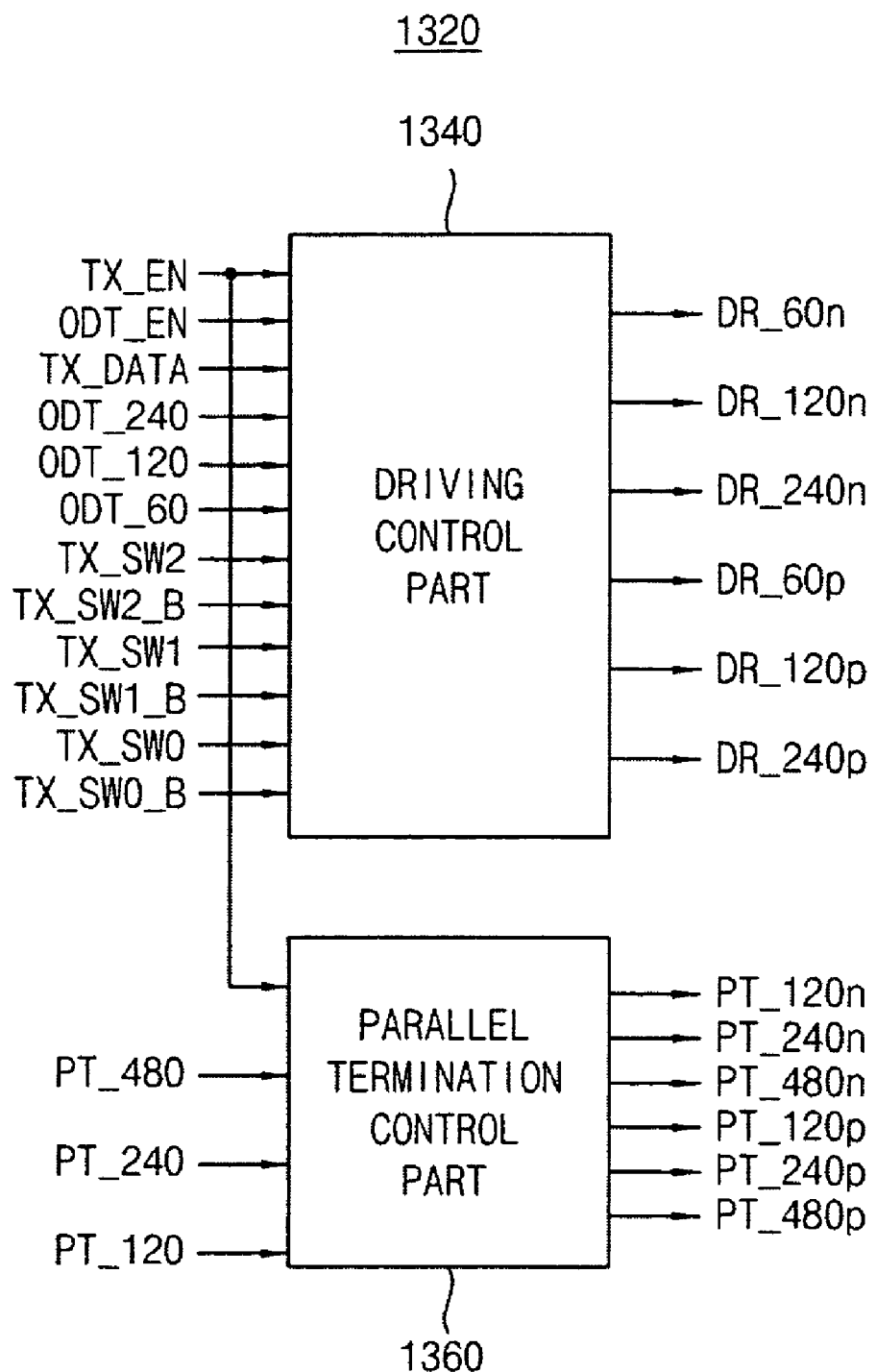
FIG. 7 is a block diagram illustrating an example embodiment of control block.

FIG. 7 is a block diagram shown an example embodiment of the control block 1320 included in the output circuit of FIG. 4.

Referring to FIG. 7, according to at least this example embodiment the control block 1320 includes a driving control part 1340 and a parallel termination control part 1360. During the output mode, the driving control part 1340 generates the first control signals DR_60n, DR_120n, DR_240n, DR_60p, DR_120p and DR_240p in response to the output enable signal TX_EN, the data signal TX_DATA and data selection signals TX_SW2, TX_SW2_B, TX_SW1, TX_SW1_B, TX_SW0, TX_SW0_B. During the input mode, the driving control part 1340 generates the first control signals in response to the on-die termination enable signal ODT_EN and on-die termination selection signals ODT_240, ODT_120, ODT_60.

The parallel termination control part 1360 generates the second control signals PT_120n, PT_240n, PT_480n, PT_120p, PT_240p, PT_480p in response to the output enable signal TX_EN and the parallel termination signals PT_480, PT_240, PT_120.

Figure 8:
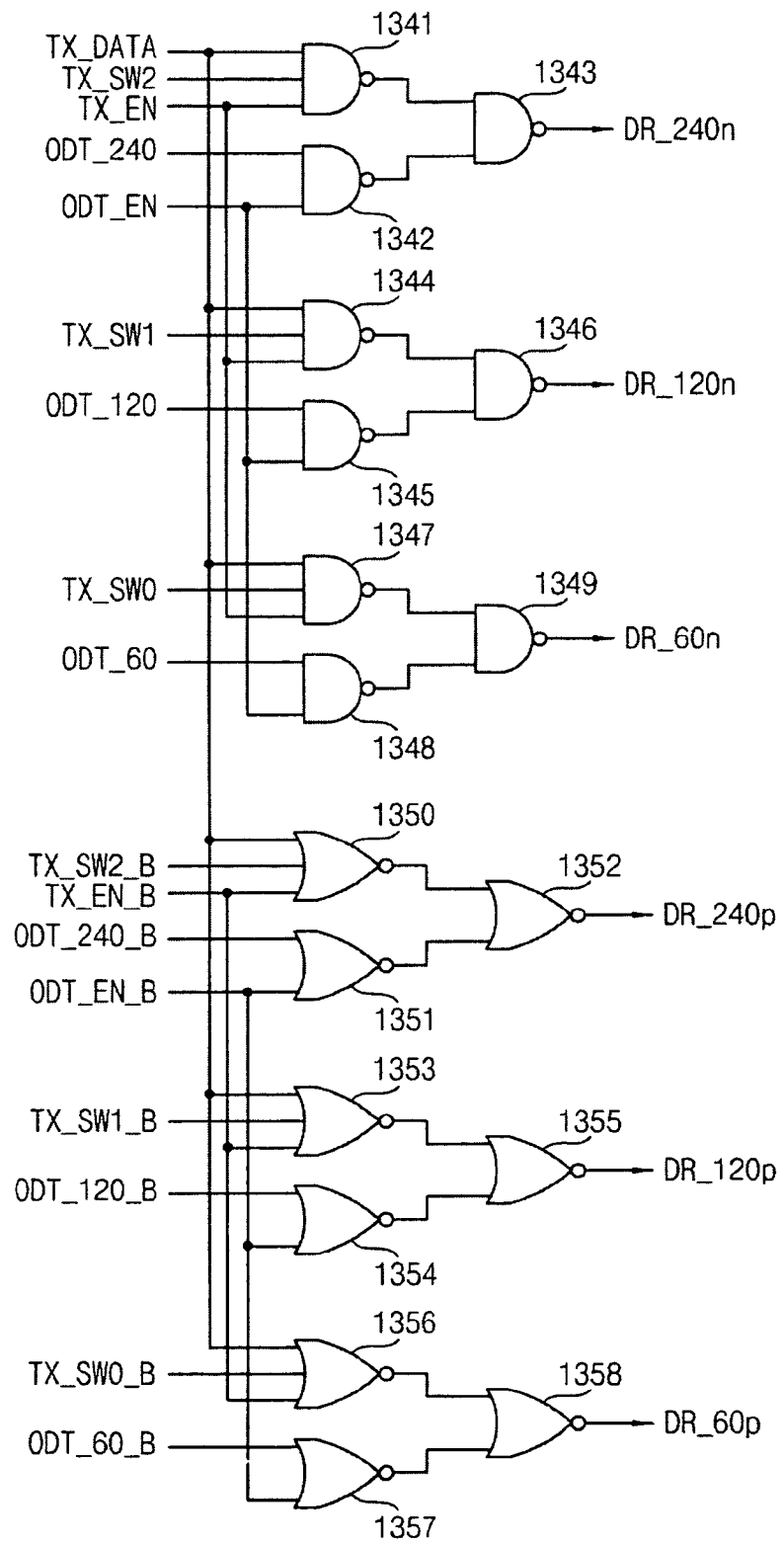
FIG. 8 illustrates an example embodiment of a driving control part.

FIG. 8 illustrates an example embodiment of the driving control part 1340 of FIG. 7 in more detail.

Referring to FIG. 8, in this example embodiment the driving control part 1340 includes a plurality of logic gates 1341 through 1358. The plurality of logic gates 1341 through 1358 are configured to generate the first control signals DR_60n, DR_120n, DR_240n, DR_60p, DR_120p and DR_240p in response to the output enable signal TX_EN, the data signal TX_DATA and data selection signals TX_SW2, TX_SW2_B, TX_SW1, TX_SW1_B, TX_SW0, TX_SW0_B during an output mode, but in response to the on-die termination enable signal ODT_EN and on-die termination selection signals ODT_240, ODT_120, ODT_60 during an input mode.

The first control signals from the driving control part 1340 may include at least one pair of first control signals like DR_240n and DR_240p. The pair of first control signals may have the same logic value (e.g., logic "1" or logic "0"). Signals having the '_B' notation denote logic "0" when activated.

The on-die termination enable signal ODT_EN is activated to logic "1" during the input mode. At least one of the ODT signals is activated to either logic "1" or logic "0" with the on-die termination enable signal ODT_EN during the input mode.

Figure 9:
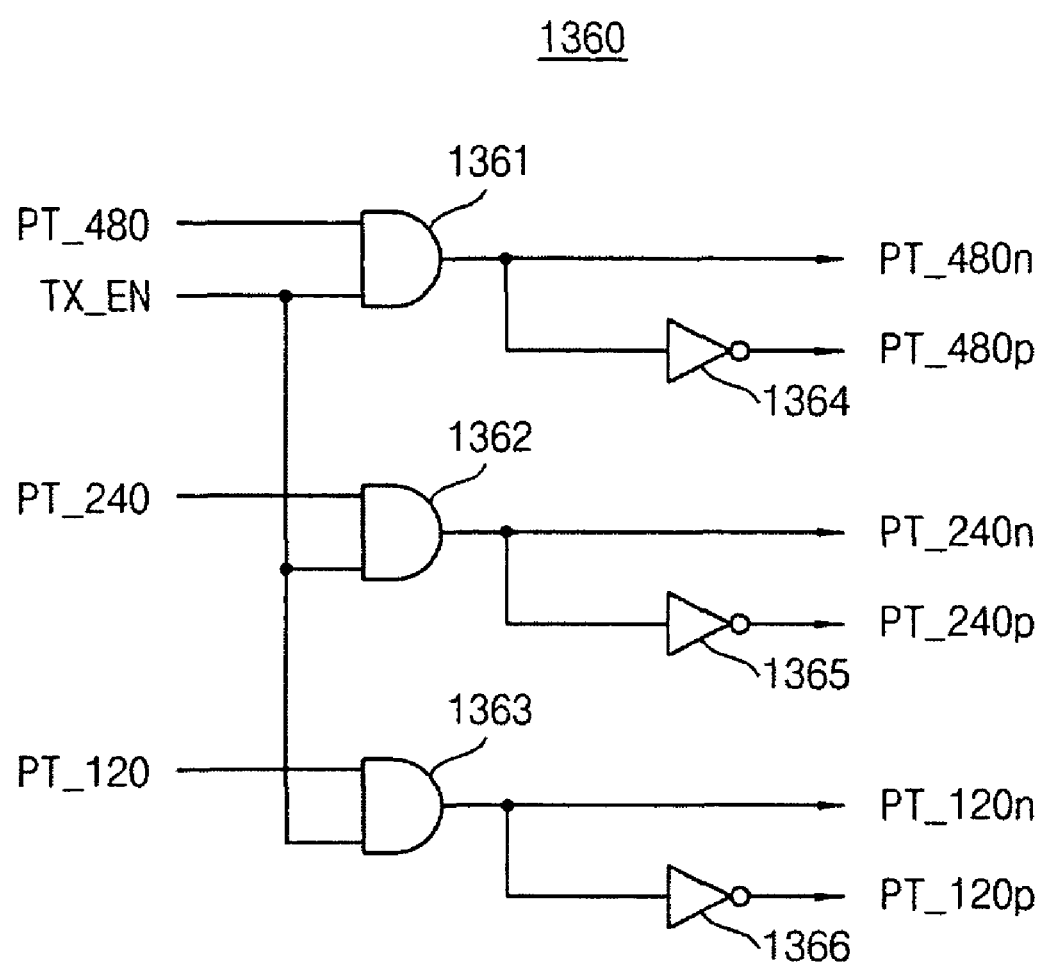
FIG. 9 illustrates an example embodiment of a parallel termination control part.

FIG. 9 illustrates an example embodiment of a parallel termination control part in more detail.

Referring to FIG. 9, according to at least this example embodiment, the parallel termination control part 1360 includes a plurality of logic gates 1361 through 1366 configured to generate the second control signals PT_120n, PT_240n, PT_480n, PT_120p, PT_240p, PT_480p in response to the output enable signal TX_EN and the parallel termination selection signals PT_120, PT_240, and PT_480. The parallel termination selection signals PT_120, PT_240, and PT_480 may be provided by the look-up table 1330 shown in FIG. 4 according to settings of a user.

FIG. 10 illustrates an example embodiment of the look-up table 1330 of FIG. 4.

Referring to FIG. 10, the look-up table 1330 shows each logic value of the data selection signals TX_SW2, TX_SW1 and TX_SW0 and the parallel termination selection signals PT_120, PT_240, and PT_480 output by the look-up table 1330 in response to the voltage swing selection signals SW_300, SW_600, SW_900, SW_1200 and SW_1500.

FIG. 10 also shows a maximum voltage VOH(V) and minimum voltage VOL(V) of a terminated output data signal (e.g., output data signal DQ_O3), value of resistance RDRV of an output driving part (e.g., output driving part 1312) a value of resistance RPT of a parallel termination part (e.g., parallel termination part 1314), and an output impedance ZOUT of an output circuit (e.g., output circuit 1300) corresponding to each of the parallel termination selection signals PT_120, PT_240, and PT_480 when the high power voltage VDD is about 1.5V and impedance of the channel connected to the output circuit is about 50Ω.

Referring to FIG. 10, the third column shows a situation in which the voltage swing selection signal SW_600 is selected by a user, the data selection signals TX_SW2, TX_SW1 and TX_SW0 become L, H and L, respectively, and the parallel termination selection signals PT_480, PT_240, and PT_120 become H, H and L, respectively. The selecting of one of the voltage swing selection signals SW_300, SW_600, SW_900, SW_1200 and SW_1500 may be performed during a power-up sequence of a semiconductor device or communication system.

Referring back to FIGS. 5 through 10 together, in the above example a resistance of about 120Ω of second circuit branch of the output driving part 1312 is selected in response to L, H and L of the data selection signals TX_SW2, TX_SW1 and TX_SW0 so that DR_120p and DR_120n are affected by the data signal. Also, a resistance of about 480Ω of fourth circuit branch and a resistance of about 240Ω of fifth circuit branch of the parallel termination part 1314 are selected in response to each of the parallel termination signals PT_480, PT_240, and PT_120 so that equivalent resistance of the selected circuit branches in the parallel termination part 1314 is about 160Ω. As a result, the impedance of the output circuit 1300 becomes about 48Ω. In this example, the maximum voltage VOH of the terminated output signal is about 1.05V and the minimum voltage VOL of the terminated output data signal is about 0.45V. And, output voltage swing width is about 600 mV.

FIGS. 11a through 11e are example waves of a terminated output signal in accordance with example embodiments. Each wave corresponds to one of parallel termination signals when VDD is 1.5V at an operating temperature of 100° C.

Figure 11A:
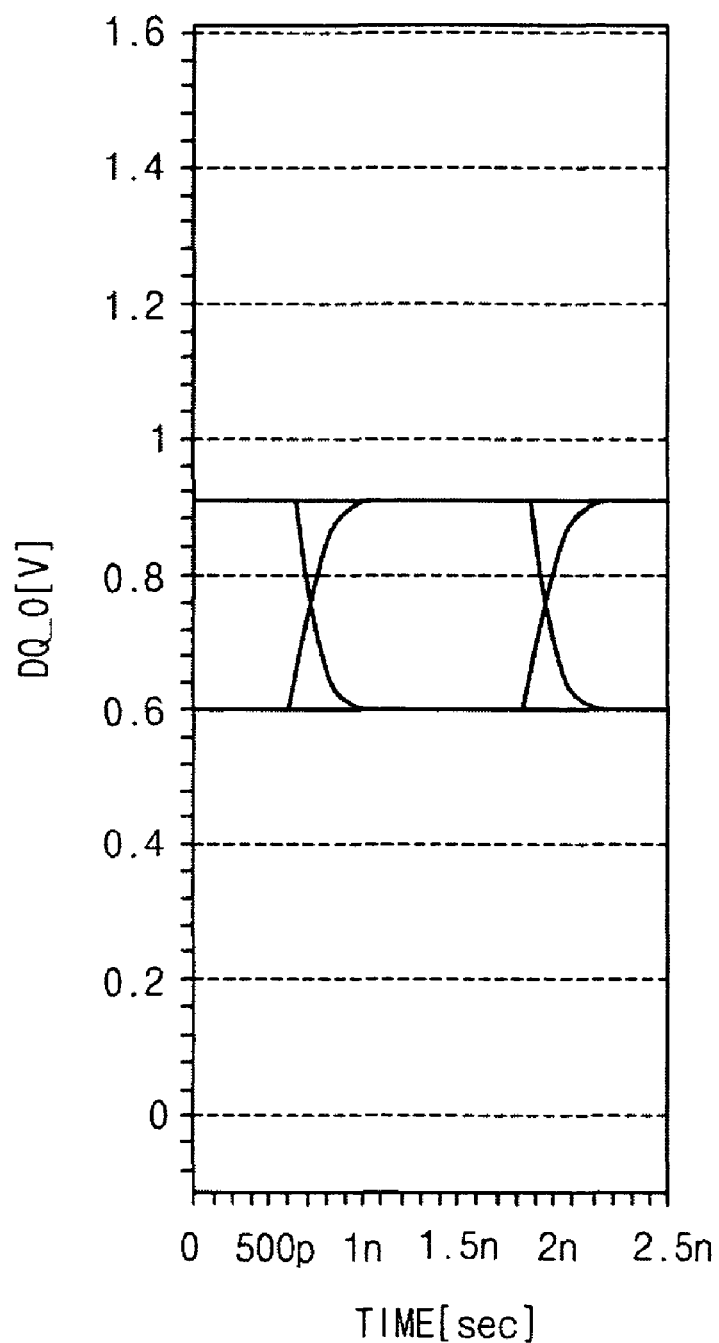
FIGS. 11a-11e show terminated output data signals with different swing level voltages in accordance with example embodiments.
Figure 11B:
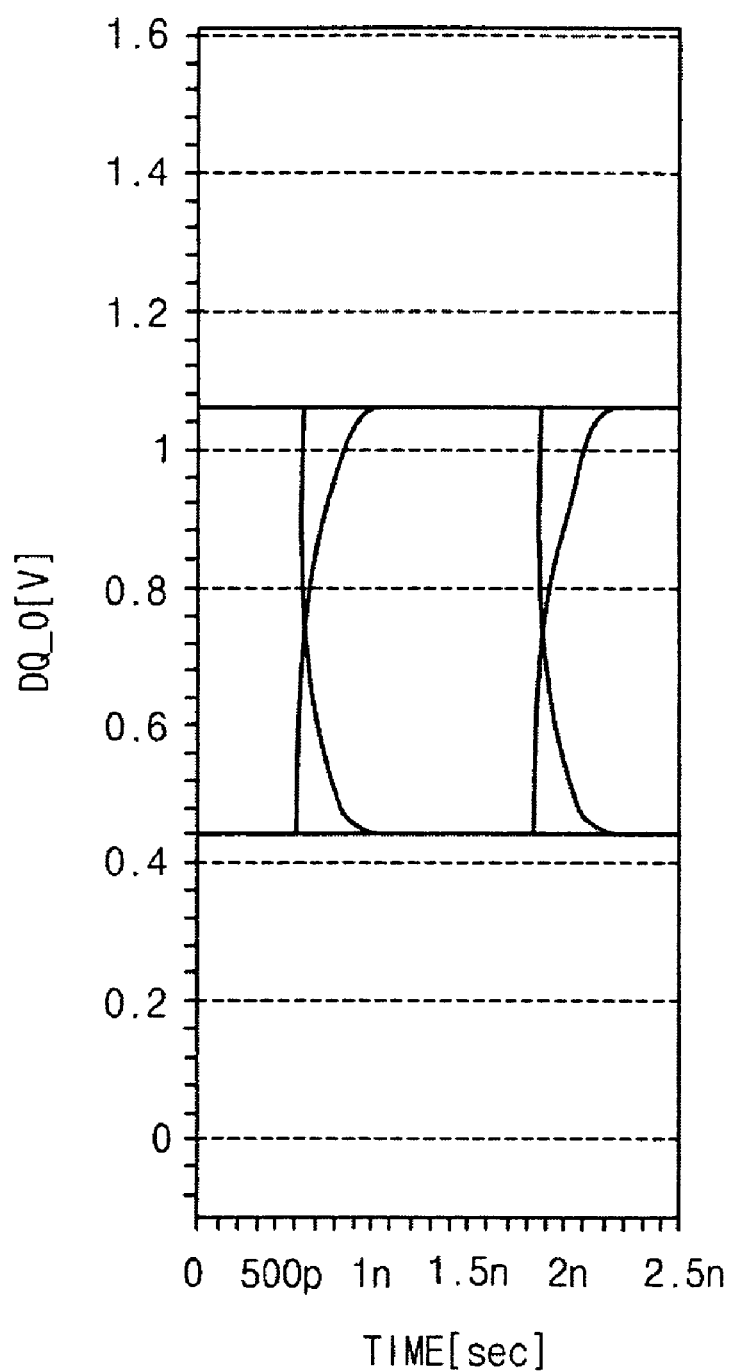
Figure 11C:
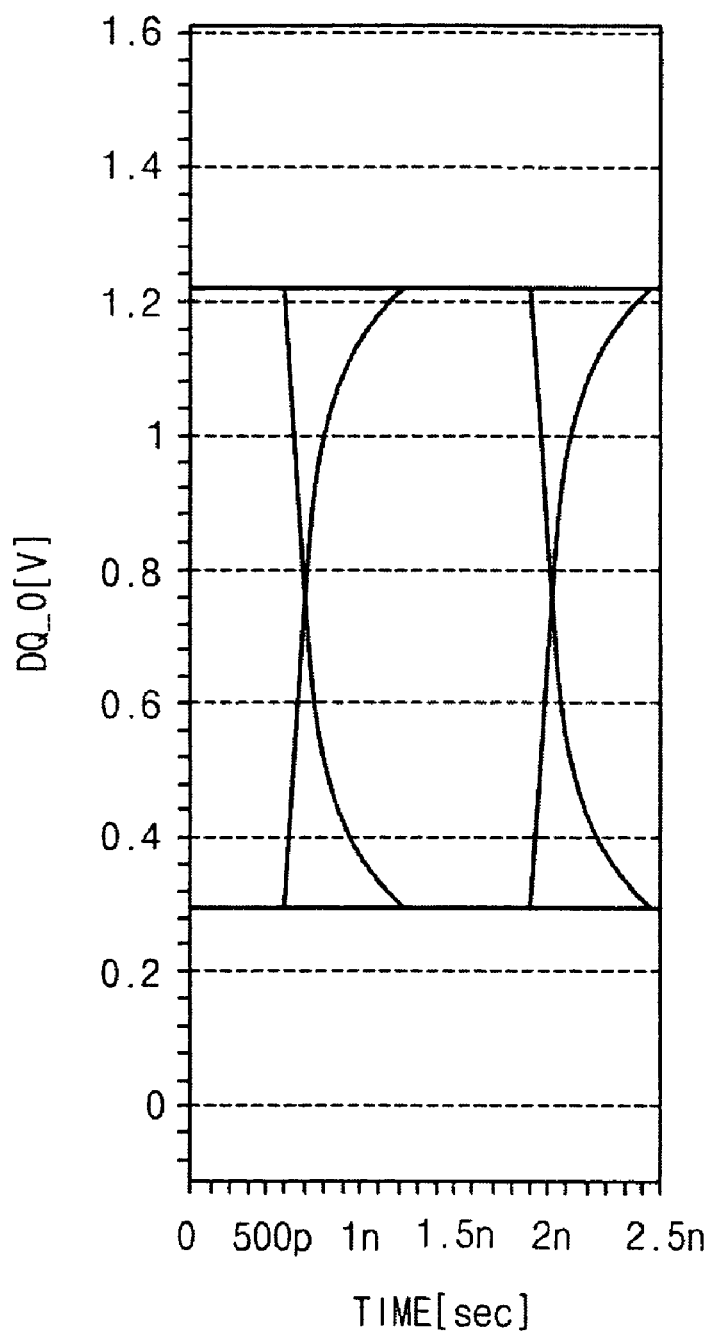
Figure 11D:
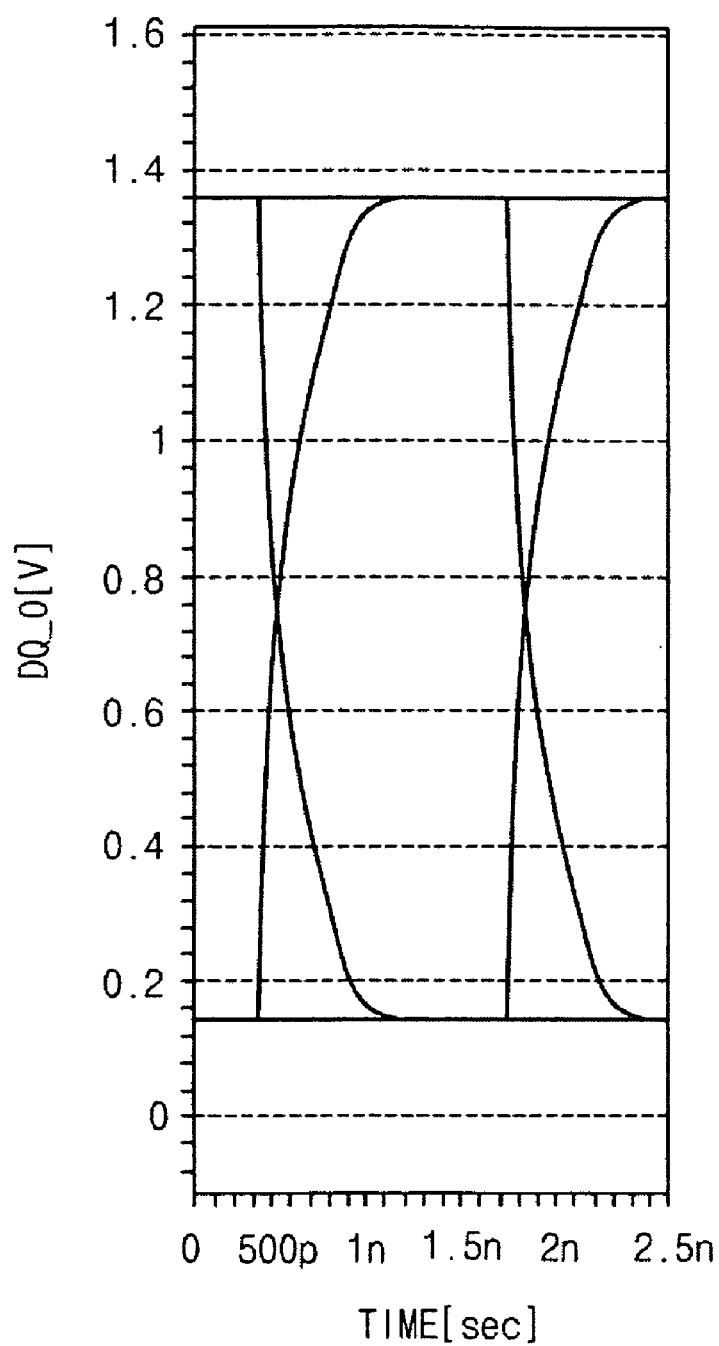
Figure 11E:
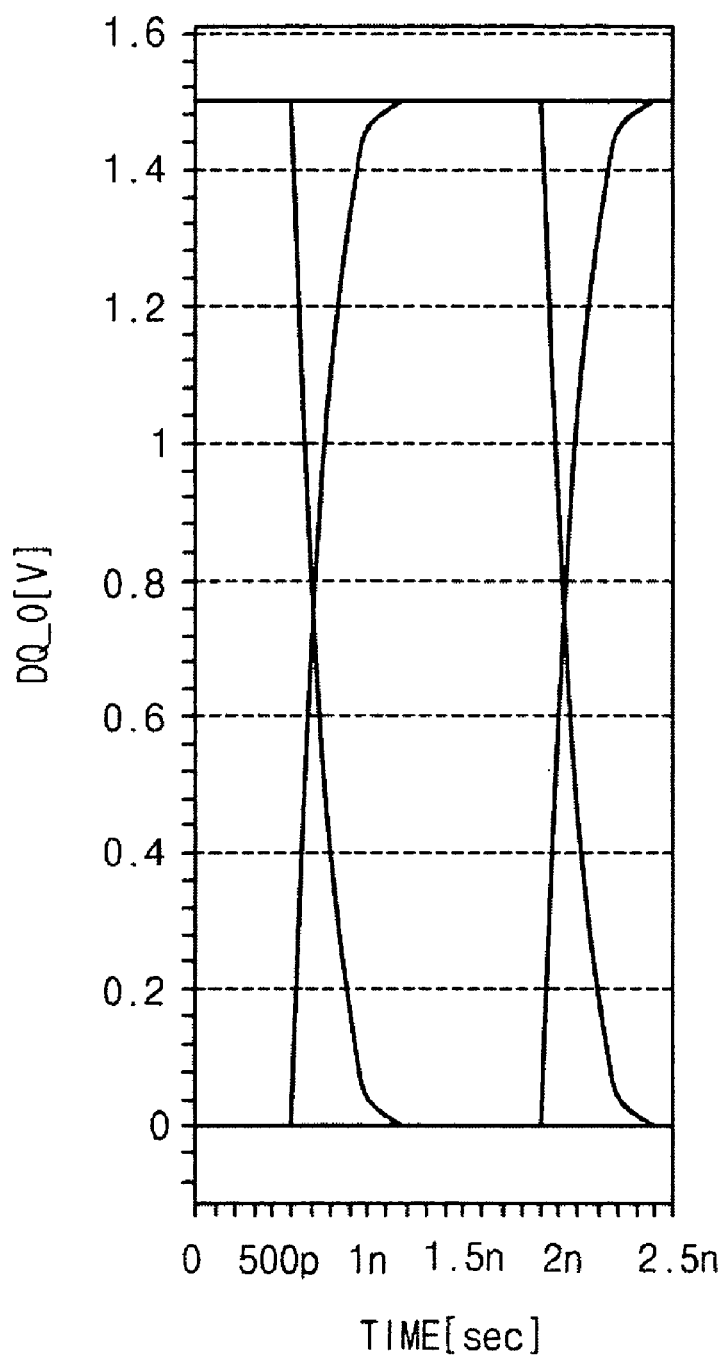

FIG. 11a shows a terminated output data signal with about 300 mV of voltage swing width. FIG. 11b shows a terminated output data signal with about 600 mV of voltage swing width. FIG. 11c shows a terminated output data signal with about 900 mV of voltage swing width. FIG. 11d shows a terminated output data signal with about 1200 mV of voltage swing width. FIG. 11e shows a terminated output data signal with about 1500 mV of voltage swing width.

As shown in FIGS. 11a-11e, all of the terminated output data signals may have relatively accurate signal integrity from relatively narrow output voltage swing widths of about 300 mV to relatively broad output voltage swing widths of about 1500 mV.

As discussed herein, output circuits according to example embodiments may have an output signal voltage swing width that varies from relatively low to relatively high while maintaining an output impedance, which matches that of a channel connected to the output circuit.

Also, the output data signal from the output circuit may have a lower voltage level while maintaining relatively accurate signal integrity when controlling high power voltage and/or low power voltage of the output driving block as explained above.

Figure 12:
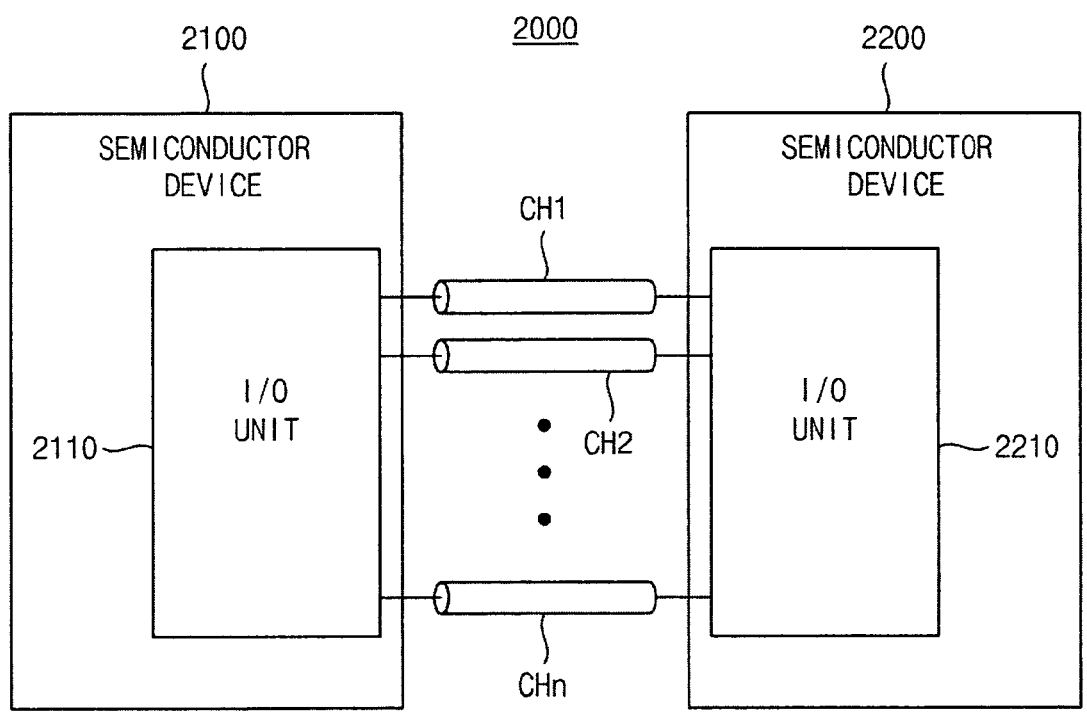
FIG. 12 is a block diagram showing a communication system including semiconductor devices connected to each other through channels according to an example embodiment.

FIG. 12 is a block diagram showing an example embodiment of a communication system.

Referring to FIG. 12, according to at least this example embodiment the communication system 2000 includes semiconductor devices 2100 and 2200 connected to each other through a plurality of channels CH1 through CHn. Each semiconductor device includes a respective input/output unit. For example, the semiconductor device 2100 includes the input/output unit 2110 and the semiconductor device 2200 includes an input/output unit 2210. Each of the input/output units 2110 and 2210 may have an input circuit and an output circuit as shown and discussed above (e.g., with regard to FIG. 3) in accordance with example embodiments. The input/output units 2110 and 2210 may include only an output circuit when the channel connected thereto is used for uni-directional signaling.

In FIG. 12, the output circuit of the input/output units 2110 and 2210 may perform on-die termination in response to on-die termination selection signals during an input mode. Also, the output circuit of the input/output units 2110 and 2210 may output a terminated output data signal having a variable voltage swing width in response to parallel termination control signals during an output mode. Thus, the communication system 2000 may have more accurate signal integrity, while an output voltage swing width varies (e.g., by a user) according to the environment of channel.

While example embodiments have been described herein, it should be understood that other variations may be possible. Such variations are not to be regarded as a departure from the spirit and scope of example embodiments described herein, and all such modifications as would be obvious to one skilled in the art are intended to be included within the scope of the following claims.

What is claimed is:

1. An output circuit comprising:
    a control block configured to generate a first control signal and a second control signal in response to a voltage swing level selection signal and an output enable signal; and
    an output driving block configured to, in response to the first and second control signals, perform on-die termination in an input mode and configured to control swing level of a signal output from the output circuit in an output mode; wherein
        the voltage swing level selection signal identifies a selected voltage swing level for the signal output from the output circuit.

2. The output circuit of claim 1, wherein the output driving block comprises:
    an output driving part configured to control the voltage swing level of the signal output from the output circuit in response to the first control signal;
    a parallel termination part configured to perform on die termination in response to the second control signal; wherein
        each of the output driving part and the parallel termination part are connected to an output node.

3. An output circuit comprising:
    a control block configured to generate a first control signal and a second control signal in response to a voltage swing level selection signal and an output enable signal, the control block including,
        a driving control part configured to generate the first control signal in response to an output data signal and a data selection signal, the data selection signal being generated based on the voltage swing level selection signal during an output mode, and
        a parallel termination control part configured to generate the second control signal in response to the output enable signal and a parallel termination selection signal, the parallel termination selection signal being generated based on the voltage swing level selection signal during the output mode; and an output driving block configured to, in response to the first and second control signals, perform on-die termination in an input mode and configured to control swing level of a signal output from the output circuit in the output mode, the output driving block including, an output driving part configured to control a voltage swing level of the signal output from the output circuit in response to the first control signal, a parallel termination part configured to perform on die termination in response to the second control signal; wherein each of the output driving part and the parallel termination part are connected to an output node.

4. An output circuit comprising:
a control block configured to generate a first control signal and a second control signal in response to a voltage swing level selection signal and an output enable signal; and an output driving block configured to, in response to the first and second control signals, perform on-die termination in an input mode and configured to control swing level of a signal output from the output circuit in an output mode; wherein the control block includes
a driving control part configured to generate the first control signal in response to an output data signal and a data selection signal, the data selection signal being generated based on the voltage swing level selection signal during the output mode, and a parallel termination control part configured to generate the second control signal in response to the output enable signal and a parallel termination selection signal, the parallel termination selection signal being generated based on the voltage swing level selection signal during the output mode.

5. The output circuit of claim 4, wherein the control block further comprises:
a lookup table configured to output the data selection signal and the parallel termination selection signal in response to the voltage swing level selection signal.

6. The output circuit of claim 4, wherein the parallel termination control part comprises:
a plurality of logic gates configured to generate the second control signal in response to the output enable signal and the parallel termination selection signal.

7. The output circuit of claim 4, wherein the driving control part is configured to generate the first control signal in response to an on-die termination enable signal and an on-die termination selection signal during an input mode.

8. The output circuit of claim 7, wherein the driving control part comprises:
a plurality of logic gates configured to generate the first control signal in response to an on-die termination enable signal and an on-die termination selection signal during an input mode.

9. The output circuit of claim 2, wherein the output driving part comprises:
at least one circuit branch, each of the at least one circuit branches including,
a first pull-up transistor and a first pull-up resistor connected serially between a first high power voltage and the output node, and
a first pull-down transistor and a first pull-down resistor connected serially between a first low power voltage and the output node, wherein
each of the first pull-up and pull-down transistors operate in response to the first control signal.

10. The output circuit of claim 9, wherein the parallel termination part includes,
at least one circuit branch, each of the at least one circuit branches includes,
a second pull-up transistor and a second pull-up resistor connected serially between a second high power voltage and the output node, and
a second pull-down transistor and a second pull-down resistor connected serially between a second low power voltage and the output node, wherein
each of the second pull-up and pull-down transistors operate in response to the second control signal.

11. The output circuit of claim 10, wherein the first high power voltage is same as the second high power voltage.

12. The output circuit of claim 10, wherein the first low power voltage is same as the second low power voltage.

13. The output circuit of claim 10, wherein the first high power voltage and the second high power voltage are different.

14. The output circuit of claim 10, wherein the first pull-up resistor and the first pull-down resistor included in the output driving part have the same value of resistance.

15. The output circuit of claim 10, wherein the second pull-up resistor and the second pull-down resistor included in the parallel termination part have the same value of resistance.

16. An output circuit comprising:
a control block configured to generate gate control signals in response to a voltage swing selection signal; and
an output driving block configured to perform on-die termination in response to the gate control signals during an input mode, and the output driving block being further configured to perform variable parallel termination to vary the voltage swing width of the terminated output data signal and output a terminated output data signal during an output mode; wherein
the voltage swing level selection signal identifies a selected voltage swing level for the output data signal.

17. An output circuit comprising:
a control block configured to generate gate control signals in response to a voltage swing selection signal;
an output driving block configured to perform on-die termination in response to the gate control signals during an input mode, and the output driving block being further configured to perform variable parallel termination to vary the voltage swing width of the terminated output data signal and output a terminated output data signal during an output mode; and
a look-up table configured to output data selection signals and parallel termination selection signals in response to a voltage swing information signal.

18. A semiconductor device comprising;
an input circuit configured to receive input data from an external device; and
the output circuit of claim 1 configured to output a terminated output data signal.

19. The semiconductor device of claim 18, wherein the output circuit further comprises:
a look-up table configured to generate output data selection signals and parallel termination selection signals in response to a voltage swing information signal.

20. A semiconductor device comprising;
an input circuit configured to receive input data from an external device; and
the output circuit of claim 16 configured to output a terminated output data signal.

* * * * *